US008093141B2

(12) United States Patent
Aoyama et al.

(10) Patent No.: US 8,093,141 B2
(45) Date of Patent: Jan. 10, 2012

(54) METHOD OF FABRICATING A SEMICONDUCTOR DEVICE

(75) Inventors: Tomonori Aoyama, Kanagawa-ken (JP); Kiyotaka Miyano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/878,780

(22) Filed: Sep. 9, 2010

(65) Prior Publication Data
US 2011/0111580 A1    May 12, 2011

(30) Foreign Application Priority Data
Sep. 11, 2009  (JP) ................ P2009-210550

(51) Int. Cl.
*H01L 21/00* (2006.01)

(52) U.S. Cl. ............ 438/482; 438/487; 257/52

(58) Field of Classification Search ........ 438/482, 438/487; 257/52
See application file for complete search history.

(56) References Cited

U.S. PATENT DOCUMENTS

| | | | | |
|---|---|---|---|---|
| 4,460,417 A * | 7/1984 | Murase et al. | ............ | 438/365 |
| 5,141,880 A * | 8/1992 | Inoue et al. | ............ | 438/149 |
| 6,559,034 B2 * | 5/2003 | Sotani | ............ | 438/463 |
| 7,105,891 B2 * | 9/2006 | Visokay et al. | ............ | 257/338 |
| 7,351,633 B2 * | 4/2008 | Kim | ............ | 438/222 |
| 7,494,852 B2 * | 2/2009 | Bedell et al. | ............ | 438/149 |
| 7,507,617 B2 * | 3/2009 | Ohnuma et al. | ............ | 438/166 |
| 7,608,522 B2 * | 10/2009 | Lin et al. | ............ | 438/455 |
| 2007/0241323 A1 * | 10/2007 | Saenger et al. | ............ | 257/19 |
| 2009/0014828 A1 | 1/2009 | Mizushima et al. | | |

FOREIGN PATENT DOCUMENTS

JP    2009-16692    1/2009

OTHER PUBLICATIONS

Moniwa, M. et al., "Influence of Si Film Thickness on Growth Enhancement in Si Lateral Solid Phase Epitaxy," Appl. Phys. Lett., vol. 52, No. 21, pp. 1788-1790, (1988).

Yin, H. et al., "Direct Silicon Bonded (DSB) Substrate Solid Phase Epitaxy (SPE) Integration Scheme Study for High Performance Bulk CMOS," 2006 International Electron Devices Meeting, Tech. Dig., pp. IEDM 06-75 to IEDM 06-78 (2006).

* cited by examiner

*Primary Examiner* — Jarrett Stark
*Assistant Examiner* — Nicholas Tobergte
(74) *Attorney, Agent, or Firm* — Finnegan, Henderson, Farabow, Garrett & Dunner, L.L.P.

(57) ABSTRACT

According to one embodiment, a method of fabricating a semiconductor device is disclosed. The method can include forming an amorphous layer on a portion of a first silicon substrate having a first plane orientation, and irradiating with micro wave on the amorphous layer to transform from the amorphous layer into a crystalline layer having the first plane orientation.

17 Claims, 10 Drawing Sheets

PMOSFET Region    NMOSFET Region

METHOD OF FABRICATING A SEMICONDUCTOR DEVICE

CROSS REFERENCE TO RELATED APPLICATION

This application is based upon and claims the benefit of priority from prior Japanese Patent Application No. 2009-210550, filed on Sep. 11, 2009, the entire contents of which are incorporated herein by reference.

TECHNICAL FIELD

Exemplary embodiments described herein relate to a method of fabricating a semiconductor device, for example, relate to the method of fabricating the semiconductor device by using solid phase epitaxial growth technology.

BACKGROUND

Solid phase epitaxial growth has been well known as one of crystal growth technologies in fabricating LSIs.

Solid phase epitaxial growth is performed mentioned below, for example. An amorphous silicon layer is formed on a silicon substrate which is used as an underlying layer and has a plane orientation.

Subsequently, lamp-heating is carried out, so that the amorphous silicon is transformed into crystal silicon which has the same plane orientation as the underlying silicon substrate.

When lamp-heating is used in solid phase epitaxial growth in such a manner, a high temperature more than 550° C. is necessary for crystal growth.

However, problems are generated in the lamp-heating in high temperature. For example, plane orientations are randomly generated to not form a single-crystalline silicon film but to form a poly-crystalline silicon film, so that a crystal including a desirable plane orientation cannot be obtained.

DETAILED DESCRIPTION

According to one embodiment, a method of fabricating a semiconductor device is disclosed. The method can include forming an amorphous layer on a portion of a silicon substrate having a first plane orientation, and irradiating with micro wave on the amorphous layer to transform from the amorphous layer into a crystalline layer having the first plane orientation.

Embodiments of the present invention will be described below in detail with reference to the attached drawings mentioned above. It should be noted that the present invention is not restricted to the embodiments but covers their equivalents. Throughout the attached drawings, similar or same reference numerals show similar, equivalent or same components.

First Embodiment

Figure 1:
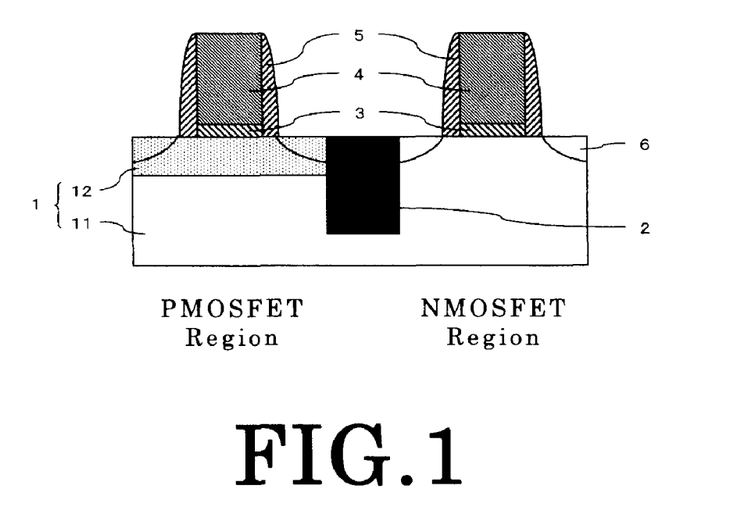
FIG. 1 is a cross-sectional view showing a method of fabricating a semiconductor device in a first embodiment.

FIG. 1 is a cross-sectional view schematically showing a complementary metal oxide semiconductor transistor, so called a CMOS transistor.

As shown in FIG. 1, a silicon substrate 1 is constituted with a (100) silicon substrate 11 having a first plane orientation (100) and a (110) silicon substrate 12 having a second plane orientation (110). A p-channel metal oxide semiconductor field effect transistor region, so called PMOSFET, is formed in a region of the (110) plane orientation in a surface of the silicon substrate 1, and n-channel metal oxide semiconductor field effect transistor, so called NMOSFET, is formed in a region of the (100) plane orientation in a surface of the silicon substrate 1.

In such a manner, the PMOSFET and the NMOSFET are formed on the silicon substrate with different plane orientations, respectively. Therefore, an operation speed of the CMOS transistor can be enhanced.

Further, an element isolation insulator 2 is formed to separate between the PMOSFET region and the NMOSFET region. The PMOSFET and the NMOSFET are formed in the PMOSFET region and the NMOSFET region, respectively. The PMOSFET and the NMOSFET are transistors, each transistor including a gate insulator 3, a gate electrode 4, a side-wall insulator 5 and diffusion layers 6. The gate insulator 3 is constituted with a silicon oxide film having a film thickness of 1.5 nm, for example. The gate electrode 4 is constituted with a poly-crystalline silicon film having a film thickness of 1.5 nm and doped with boron or phosphorus.

The gate insulator 3 may be a high-k insulator such as an oxi-nitride hafnium-silicon (HfSiON) film having a film thickness of 2 nm, for example. A composition of the PMOSFET may be different from a composition of the NMOSFET. The gate electrode 4 may be a layered structure in which a poly-crystalline silicon film having a film thickness of 80 nm and a titanium nitride (TiN) film having a film thickness of 20 nm in order, for example. Further, the film thickness and the film species of the PMOSFET may be different from the film thickness and the film species of the NMOSFET, respectively.

Next, as reference to FIGS. 2-5, a method of fabricating the CMOS transistor according to the first embodiment is explained.

Figure 2:
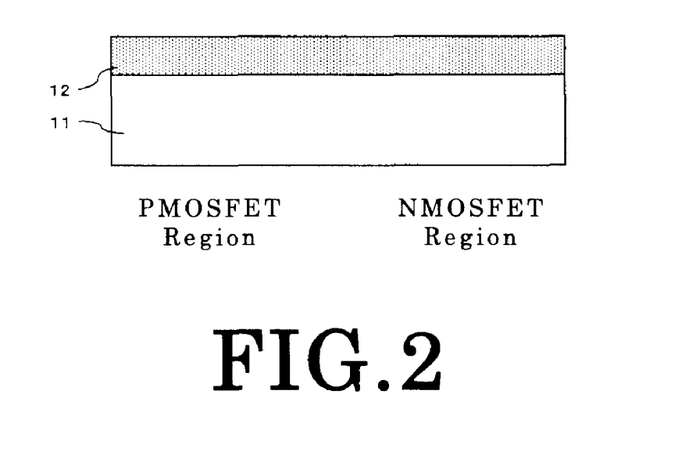
FIG. 2 is a cross-sectional view showing the method of fabricating the semiconductor device in the first embodiment.

After (110) silicon substrate 12 is stacked on the (100) silicon substrate 11 as shown in FIG. 2, the silicon substrate 1 is polished to thin the (110) silicon substrate 12. In the process, the (110) silicon substrate 12 may be at least in a channel portion of the transistor and the thickness of the (110) silicon substrate 12 is necessary to be thinner than the thickness of the element isolation insulator 2 successively formed in the processing steps.

Figure 3:
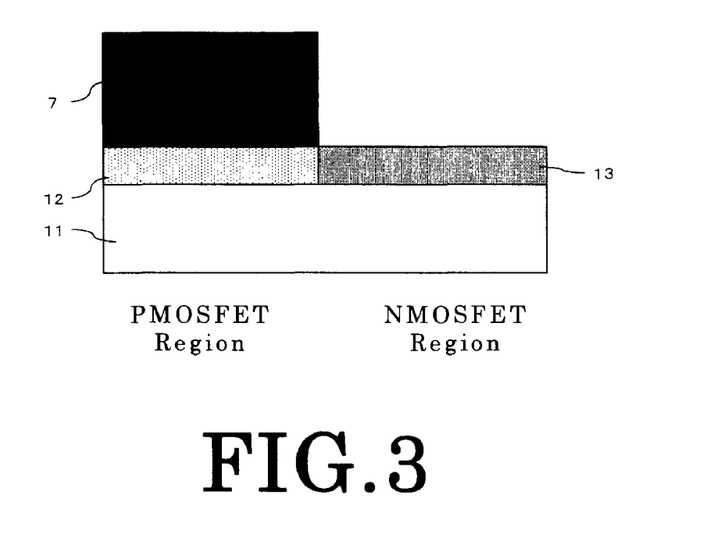
FIG. 3 is a cross-sectional view showing the method of fabricating the semiconductor device in the first embodiment.

As shown in FIG. 3, germanium ions, for example, are implanted into the NMOSFET region after the PMOSFET region is covered with a resist. The (110) silicon substrate 12 in the NMOSFET region is transformed into an amorphous silicon region 13 being an amorphous layer. In the process, crystalline defects are generated near an interface between the amorphous silicon region 13 and the (100) silicon substrate 11. Further, a mask covering the PMOSFET region is not restricted to the resist, but a silicon oxide film and a silicon nitride film may also be used as the mask. Ion species for forming the amorphous silicon region 13 is not restricted to germanium but $BF_2$ ion can also be used in the ion-implantation.

Figure 4:
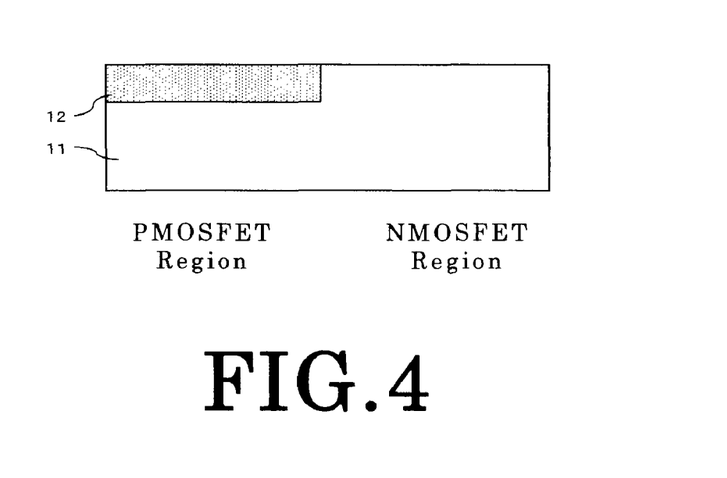
FIG. 4 is a cross-sectional view showing the method of fabricating the semiconductor device in the first embodiment.

After removing the resist 7 as shown in FIG. 4, the silicon substrate 1 is irradiated with micro wave at a frequency of equal or less than 25 GHz. In the process, a micro wave power is set to be more than 10 $W/cm^2$ and equal or less than 10 $kW/cm^2$ and an irradiating time is set to be more than 30 seconds and equal or less than one hour. The amorphous silicon region 13 is transformed into a crystalline layer having the same plane orientation as the (100) silicon substrate 11 by such the irradiation process using micro wave. In other words, the amorphous silicon region 13 is crystallized to be transformed into the crystalline layer constituted with (100) silicon. In such a manner, the silicon substrate 1 having two kinds of the (110) silicon substrate 12 and the (100) silicon substrate 11 is obtained in the surface region.

Further, polarization inversion is periodically generated in the silicon by being irradiated with micro wave, so that vibration in the silicon is excited. As a result, the temperature of the silicon substrate 1 is increased to be more than 200° C. and equal or less than below 550° C.

The micro wave frequency may set to be 2.45 GHz, 5.80 GHz or 24.125 GHz which are assigned as Industrial, Scientific and Medical Use (ISM). This is because magnetron or the like for generating micro wave can be obtained in cheap price. Further, micro wave conventionally used in the process has a constant frequency width in which 2.45 GHz, 5.80 GHz, 24.125 GHz mentioned above are included.

Figure 5:
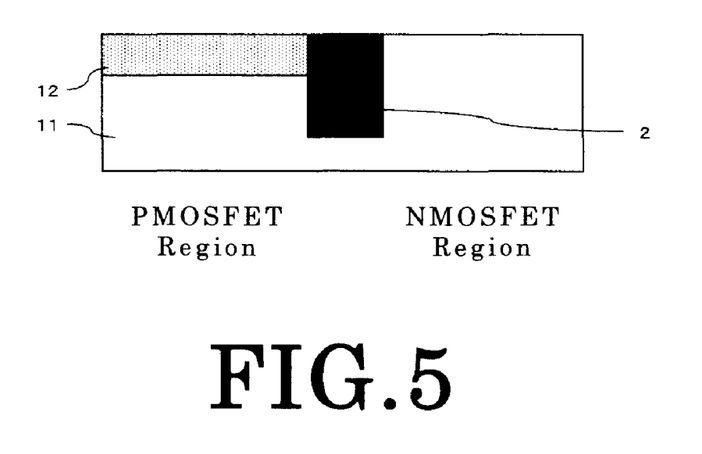
FIG. 5 is a cross-sectional view showing the method of fabricating the semiconductor device in the first embodiment.

As shown in FIG. 5, the element isolation insulator 2 for separating between the PMOSFET region and the NMOSFET region is formed by a conventional method. In the process, the bottom of the element isolation insulator 2 is necessary to be deeper than the interface between the (110) silicon substrate 12 and the (100) silicon substrate in the PMOSFET region.

Successively, the gate insulator 3, the gate electrode 4, the side-wall insulator 5 and the diffusion layers 6 are formed in the PMOSFET region and the NMOSFET region, respectively, by a conventional method to form the CMOS transistor as shown in FIG. 1.

In this embodiment, solid phase epitaxial growth is proceeded by micro wave irradiation. However, conventional lamp-heating in stead of micro wave irradiation causes a problem mentioned below.

Figure 6:
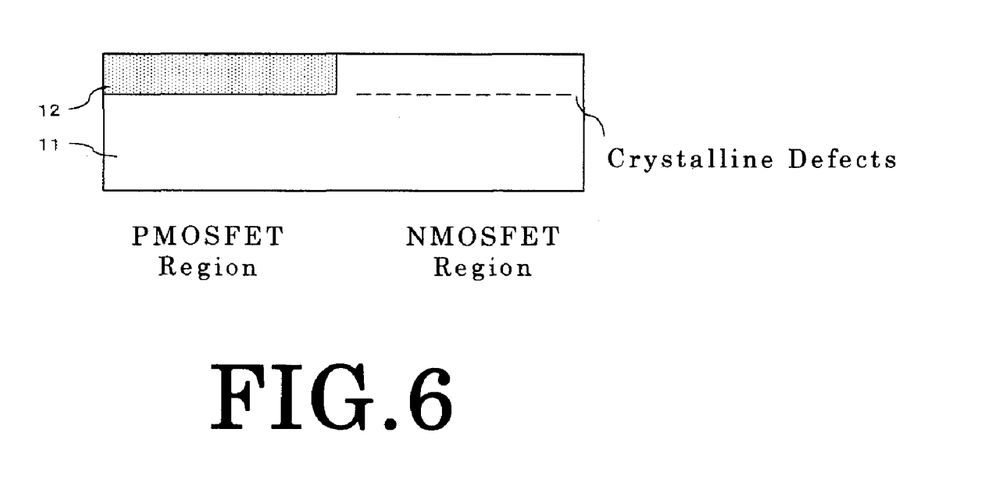
FIG. 6 is a cross-sectional view showing a method of fabricating a semiconductor device in conventional technology.

When an amorphous silicon region 13 is formed by ion implantation as shown in FIG. 3, the crystalline defects are induced near interface between the amorphous silicon region 13 and the (100) silicon substrate 11. In a case that lamp-heating is insufficient, for example, at 1000° C., for 10 seconds, the crystalline defects are leaved as shown in FIG. 6 to cause a junction leakage current in the transistor. This is a significant problem.

Figure 7:
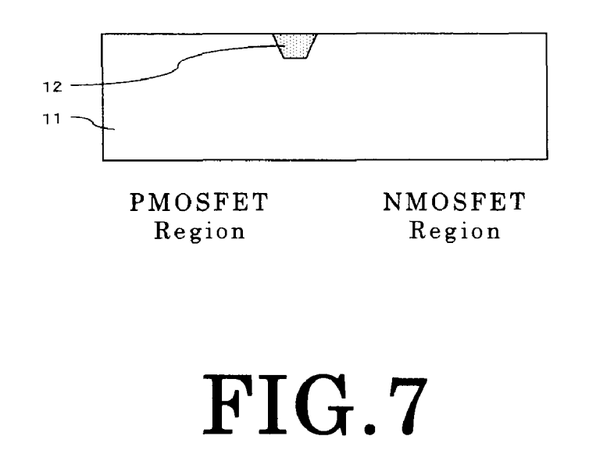
FIG. 7 is a cross-sectional view showing the method of fabricating the semiconductor device in conventional technology.

Further, in a case that lamp-heating temperature is higher to eliminate the crystalline defects or a case that lamp-heating time is longer in spite of lower temperature, the (110) silicon substrate 12 is gradually shifted to the (100) silicon substrate 11 to narrow or eliminate the region of the (110) silicon substrate 12 as shown in FIG. 7. This is because the (100) silicon substrate 11 has a smaller surface energy than that of the (110) silicon substrate 12, so that the (100) silicon substrate 11 is stable.

In such a manner, the silicon substrate having the two plane orientation being (110) and (100) cannot be formed, when the lamp-heating is used in solid phase epitaxial growth.

micro wave irradiation is used in solid phase epitaxial growth according to this embodiment. When the amorphous silicon region 13 is irradiated with micro wave, the silicon atoms in the amorphous silicon region 13 are vibrated to migrate to positions of the crystalline lattice, so that the amorphous silicon region 13 is crystallized. Further, crystallization in the amorphous silicon region 13 is proceeded from the interface between the (100) silicon substrate 11 and the amorphous silicon region 13. Accordingly, the crystalline defects generated by ion implantation can be leaved, so that the amorphous silicon region 13 can be formed as the (100) single-crystalline which inherits from crystal information of the (100) silicon substrate 11.

The silicon substrate 1 may be heated by a heater in being irradiated with micro wave. However, the temperature of the silicon substrate 1 is also increased. Consequently, a heating source other than micro wave may be not used. As the temperature of the silicon substrate 1 may be equal or less than below 550° C., the region of the (110) silicon substrate 12 cannot be shrunk.

Further, a rate of solid phase epitaxial growth can be controlled only by the micro wave power. For example, the micro wave power being more than 1000 $W/cm^2$ can crystallize the amorphous silicon region 13 in treatment time equal or less than 5 minutes.

As shown in FIG. 1, the CMOS transistor having the gate insulator 3, the gate electrode 4, the side-wall insulator 5 and the diffusion layers 6 is formed. However the device is not restricted to the CMOS transistor, memories may be also formed.

Second Embodiment

A method of fabricating a semiconductor device according to a second embodiment will be described below in detail with reference to FIGS. 8-11.

In the second embodiment, solid phase epitaxial growth by micro wave irradiation in forming a transistor in a SOI (silicon on insulator) region is described as an example.

Figure 8:
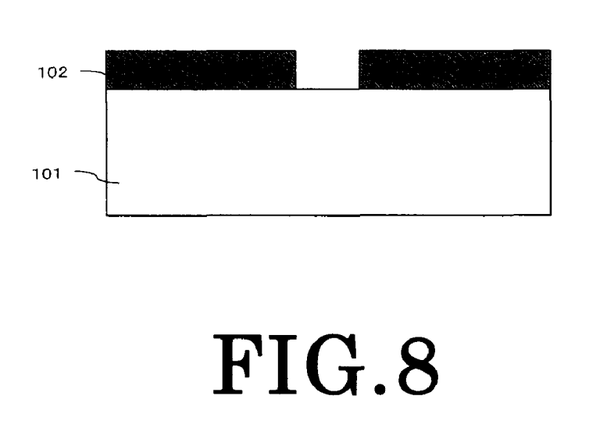
FIG. 8 is a cross-sectional view showing a method of fabricating a semiconductor device in a second embodiment.

As shown in FIG. 8, a silicon oxide film 102 having a film thickness of 200 nm is formed on a silicon substrate 101, successively a portion of the silicon oxide film 102 is etched by RIE using a resist as a mask, for example, to form an opening. The silicon substrate 101 is exposed at the opening.

Figure 9:
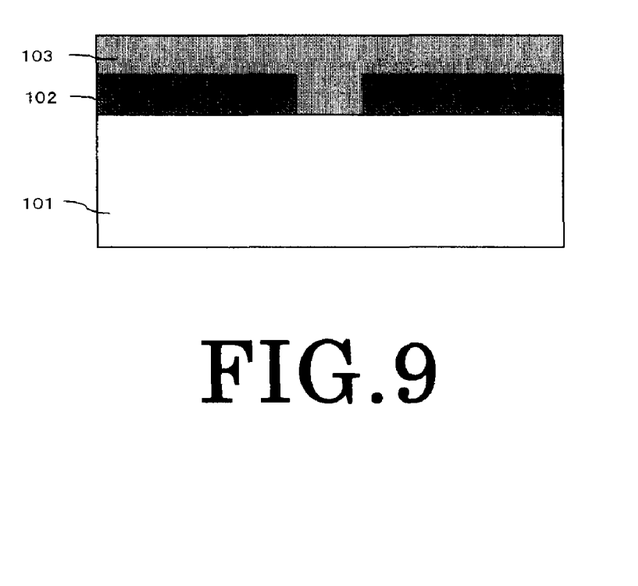
FIG. 9 is a cross-sectional view showing the method of fabricating the semiconductor device in the second embodiment.

As shown in FIG. 9, an amorphous silicon film 103 being an amorphous layer having a film thickness of 200 nm is formed on the exposed silicon substrate 101 and the silicon oxide film 102, and the amorphous silicon film 103 is formed by low pressure CVD using SiH4 gas at a temperature of 550° C., for example.

Figure 10:
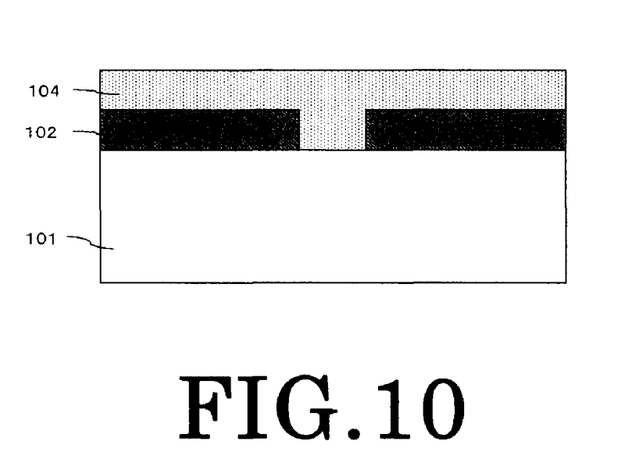
FIG. 10 is a cross-sectional view showing the method of fabricating the semiconductor device in the second embodiment.

As shown in FIG. 10, the silicon substrate 101 is irradiated with micro wave which is set to be more than 2.45 GHz and below 25 GHz. In the process, a power of the micro wave is set to be more than 10 W/cm$^2$ and equal or less 10 kW/cm$^2$ and an irradiating time is set to be more than 30 seconds and below one hour. In such micro wave irradiation, the amorphous silicon film 103 is transformed into a crystalline layer having the same plane orientation as the silicon substrate 101. Silicon atoms in amorphous silicon film 103 are vibrated by irradiating with micro wave to migrate into positions of the crystalline lattice. In such a manner as the solid phase epitaxial growth, the amorphous silicon film 103 is crystallized to be transformed to be a single-crystalline silicon film 104.

Figure 11:
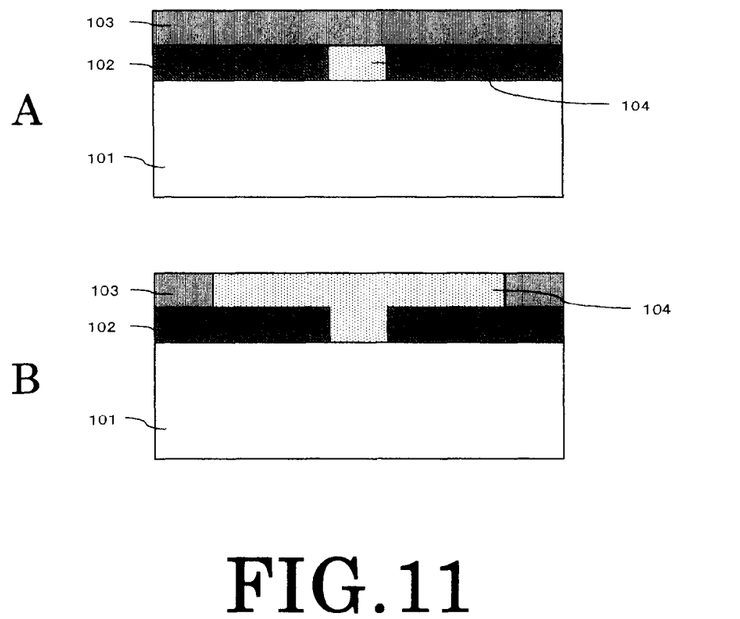
FIG. 11 is a cross-sectional view showing the method of fabricating the semiconductor device in the second embodiment.

First, crystallization is proceeded from an interface between the silicon substrate 101 and the amorphous silicon film 103 towards the thickness direction of the amorphous silicon film 103 and further proceeded to the same height as the upper surface of the amorphous silicon film 103 as shown in FIG. 11A. Successively, crystallization is proceeded to the parallel direction in the upper surface of the amorphous silicon film 103 as shown in FIG. 11B. In such a manner, the SOI region is formed.

Figure 12:
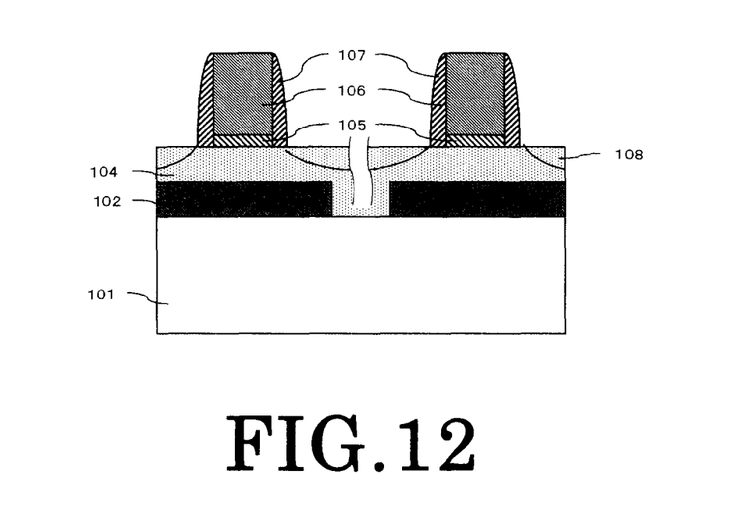
FIG. 12 is a cross-sectional view showing a method of fabricating a semiconductor device in conventional technology.

Further, CMP may be carried out for adjusting a height between the SOI region and a region other than the SOI region. Subsequently, a MOSFET constituted with a gate insulator 105, a gate electrode 106, a side-wall insulator 107 and diffusion layers 108 is formed on the SOI region by a conventional method as shown in FIG. 12.

Figure 13:
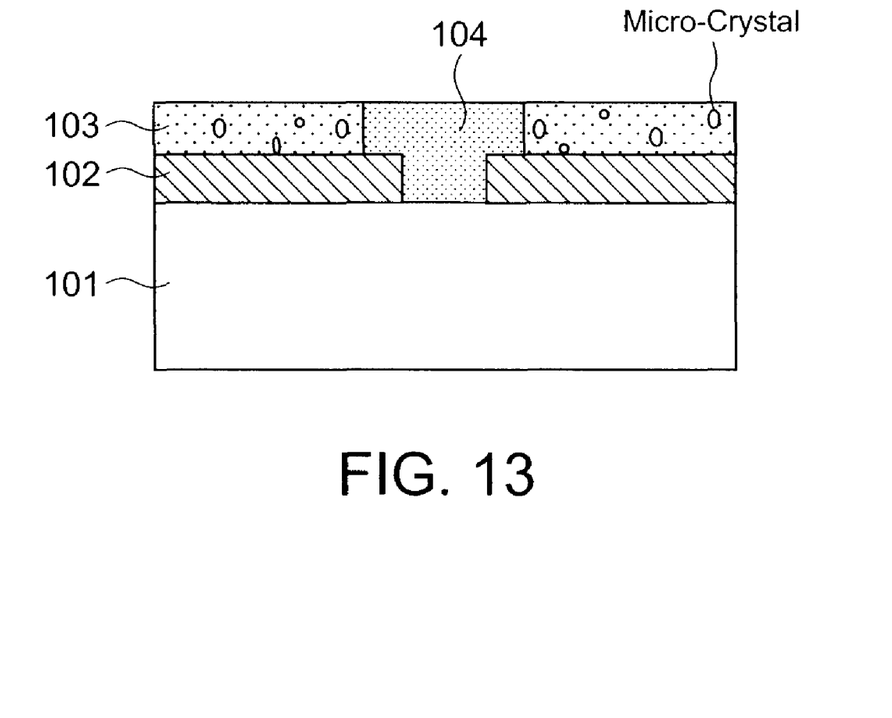
FIG. 13 is a cross-sectional view showing the method of fabricating the semiconductor device in the second embodiment.

When lamp-heating is conventionally applied to solid phase epitaxial growth, heating at more than 600° C. is necessary in consideration with through-put, because several hours are used for the heat treatment. In such a case, as shown in FIG. 13, micro crystals are generated in the amorphous silicon film 103 and an interface between the amorphous silicon film 103 and the silicon oxide film 102. The average size of the micro crystals is determined by nucleation frequency N (piece/s) and nucleus growth rate Vc (m/s) to be represented as Vc/N (piece/m). Such the micro crystals act as the crystal nuclei to easily form a polycrystalline silicon film. Accordingly, forming the single-crystalline silicon film 104 having a sufficient area for forming transistors is difficult.

On the other hand, solid phase epitaxial growth by micro wave irradiation is carried out in this embodiment. The silicon substrate 101 is heated up to more than 200° C. and equal or less than 550° C., typically 525° C., by microwave irradiation. As the temperature of 525° C. is relatively lower, generation of the micro crystals can be suppressed as shown in FIG. 13. In other words, as a number of the crystal nuclei by the micro crystals cannot be generated, only the solid phase growth is proceeded. In such processes, a treating time is more than 30 seconds and equal or less than one hour, so that the through-put can be improved as compared to a conventional process.

The amorphous silicon film 103 is crystallized in this embodiment. However, a target for the crystallization is not restricted to the amorphous silicon, silicon including germanium or carbon may be used.

Ion implantation with germanium or argon may be carried out into the whole silicon substrate 101 to remove a natural silicon oxide film at an interface between the silicon substrate 101 and the amorphous silicon film 103, after the amorphous silicon film 103 is grown.

Figure 14:
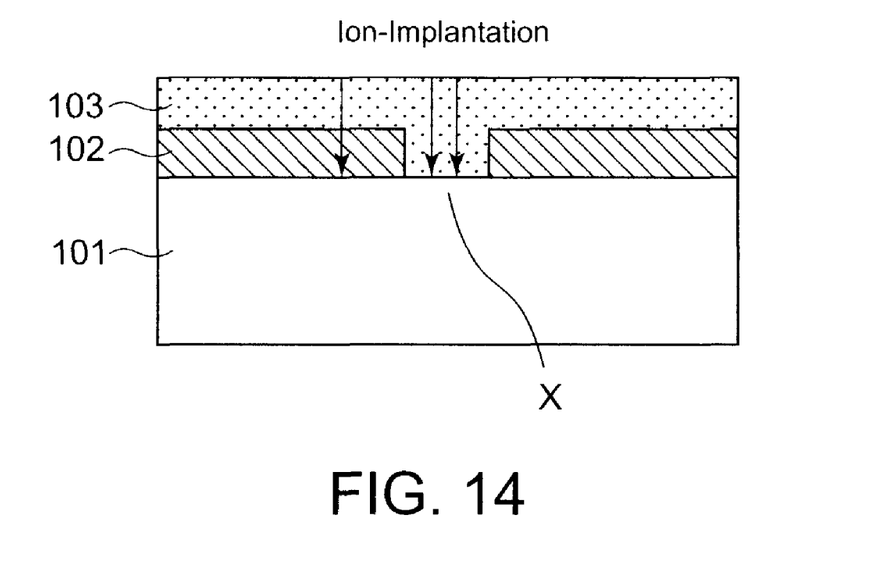
FIG. 14 is a cross-sectional view showing the method of fabricating the semiconductor device in the second embodiment.

In the processes, as shown in FIG. 14, ion-implanting is necessary to be performed by an acceleration energy which can penetrate through the amorphous silicon film 103 on an opening X in the silicon oxide film 102. Therefore, ions are also implanted into the interface between the silicon substrate 101 and the silicon oxide film 102. Consequently, the interface between the silicon substrate 101 and the silicon oxide film 102 is mixed, so that an upper region of the silicon substrate 101 is transformed into an amorphous silicon layer.

Further, crystalline defects generated in the silicon substrate 101 by the ion implantation are recovered by the micro wave irradiation in solid phase epitaxial growth processes.

Figure 15:
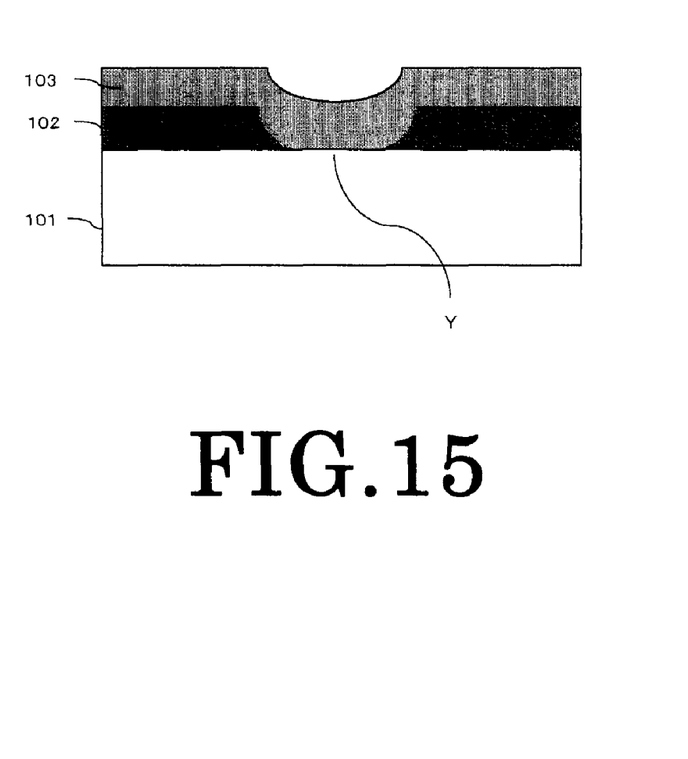
FIG. 15 is a cross-sectional view showing the method of fabricating the semiconductor device in the second embodiment.

Further, the silicon oxide film 102 is not necessary to be perpendicularly etched to the silicon substrate 101 as this embodiment. As shown in FIG. 15, an opening Y in the silicon oxide film 102 may be etched as a curve line. For example, when a portion of the silicon oxide film 102 is opened, the silicon oxide film 102 is etched by a chemical such as an HF solution to form a shape as shown in FIG. 15.

In the shape of FIG. 15, the silicon substrate 101 is ion-implanted after forming the amorphous silicon film 103, so that the natural silicon oxide film at the interface between the silicon substrate 101 and the amorphous silicon film 103 may be removed.

In this case, when ion-implanting is carried out by the acceleration energy which can penetrate through the amorphous silicon film 103 on an opening Y in the silicon oxide film 102, the ions is not implanted at the interface between the silicon substrate 101 and the silicon oxide film 102. This phenomenon is occurred by a reason mentioned below. The film thickness of the amorphous silicon film 103 at the opening Y in the silicon oxide film 102 is thinner than the total film thickness of the silicon oxide film 102 and the amorphous silicon film 103 at a portion with no-opening area.

Figure 16:
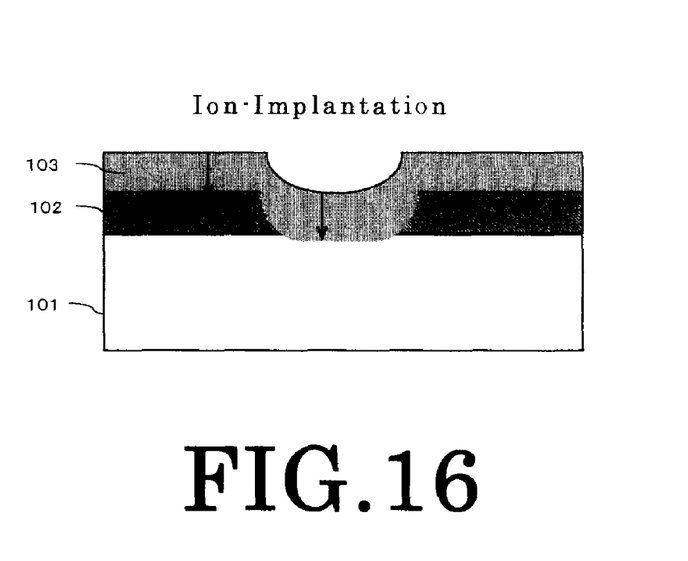
FIG. 16 is a cross-sectional view showing the method of fabricating the semiconductor device in the second embodiment.

Accordingly, amorphous silicon film 103 is formed below the interface between the silicon oxide film 102 and the silicon substrate 101 as the shape as shown in FIG. 16 after the ion implantation. However, the interface between the silicon oxide film 102 and the silicon substrate 101 is not transformed into the amorphous silicon.

Further, hydrogen annealing at a temperature of 800° C. is performed before forming the amorphous silicon film 103, so that the natural silicon oxide film on the exposed silicon substrate 101 can be removed. In the process, hydrogen annealing and forming amorphous silicon film 103 may be performed in the same furnace or be successively performed using a cluster apparatus without breaking vacuum state. In the processes, as the exposed silicon substrate 101 is not exposed in an atmosphere between forming the amorphous silicon film 103 and hydrogen annealing, the natural silicon oxide film at the interface between the silicon oxide film 102 and the silicon substrate 101 can be eliminated or be thinned.

Figure 17:
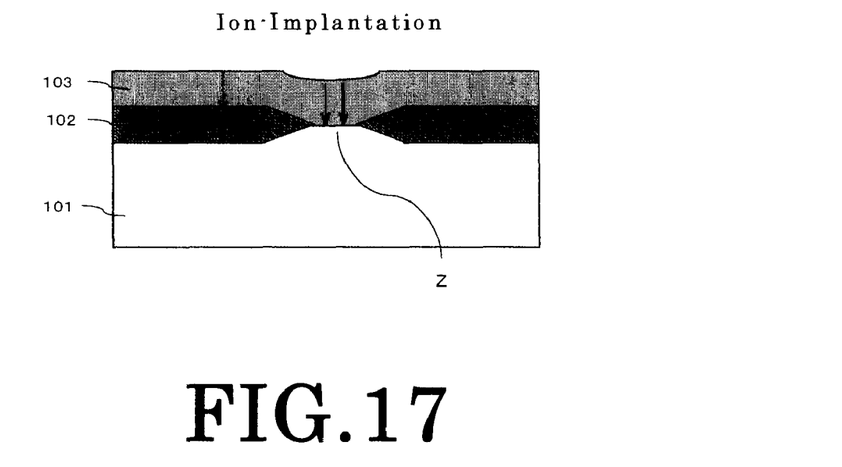
FIG. 17 is a cross-sectional view showing the method of fabricating the semiconductor device in the second embodiment.

Further, the silicon oxide film 102 is not necessary to be perpendicularly etched to the silicon substrate 101 as this embodiment. As shown in FIG. 17, the silicon oxide film 102 may be obliquely etched.

Figure 18:
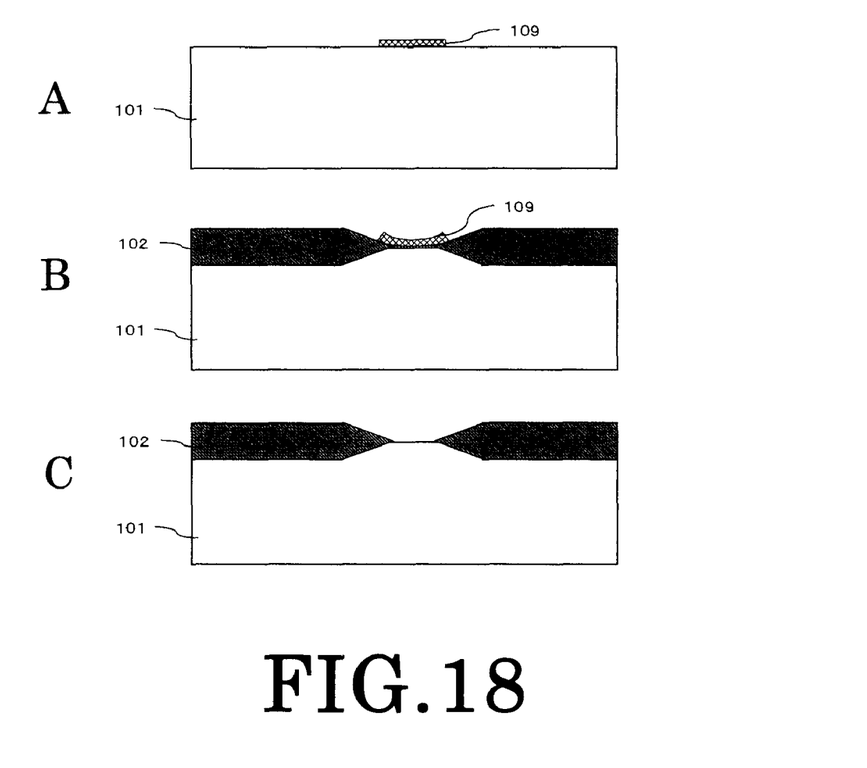
FIG. 18 is a cross-sectional view showing the method of fabricating the semiconductor device in the second embodiment.

The shape as shown in FIG. 17 can be formed as shown in FIG. 18. A silicon nitride film is formed on a portion of the silicon substrate 101 as shown in FIG. 18A. Subsequently, the whole silicon substrate 101 is oxidized to form the silicon oxide film 102 as shown in FIG. 18B. Subsequently, the silicon nitride film 109 is removed by a chemical solution to form an opening Z as shown in FIG. 18C. Further, the amorphous silicon film 103 is whole formed after a natural silicon oxide film is removed by a chemical solution such as a HF solution.

In such the processes, when ion-implanting is carried out by the acceleration energy which can penetrate through the amorphous silicon film 103 on an opening Z in the silicon oxide film 102, the ions are not implanted at the interface between the silicon substrate 101 and the silicon oxide film 102 as the same as the shape as shown in FIG. 15.

Figure 19:
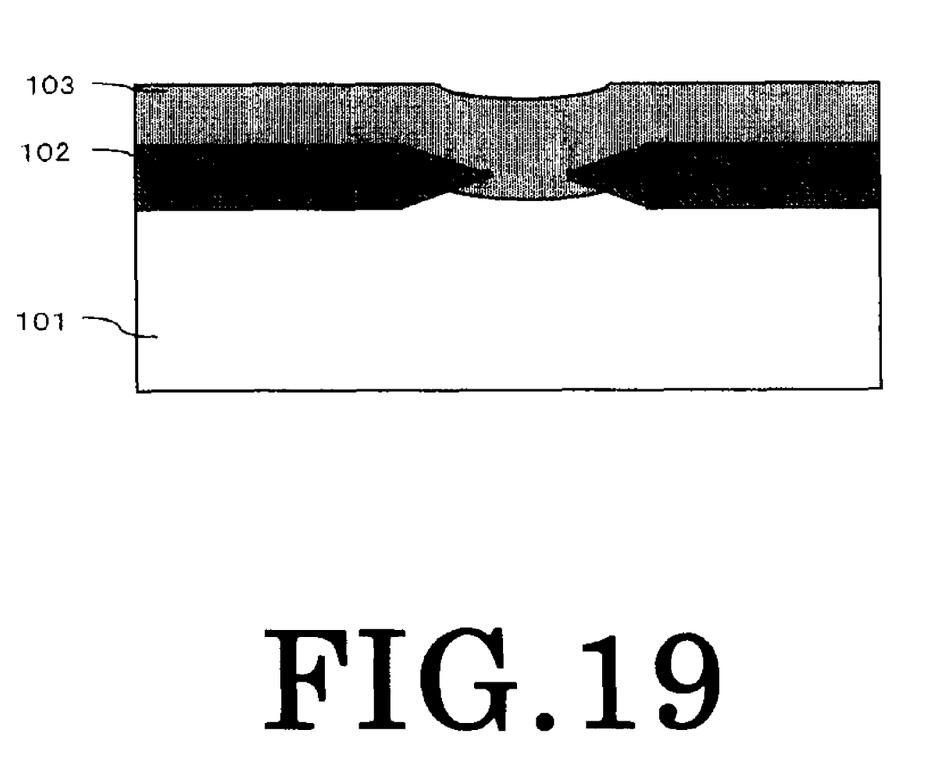
FIG. 19 is a cross-sectional view showing the method of fabricating the semiconductor device in the second embodiment.

Accordingly, the amorphous silicon film 103 is formed below the interface between the silicon oxide film 102 and the silicon substrate 101 as the shape as shown in FIG. 19 after the ion implantation. However, the interface between the silicon oxide film 102 and the silicon substrate 101 is not transformed into the amorphous silicon.

Further, hydrogen annealing may be performed before forming the amorphous silicon film 103, or hydrogen annealing and forming amorphous silicon film 103 may be performed in the same furnace.

In this embodiment, the transistor is formed on the SOI region as shown in FIG. 12. However, a product is not restricted to the transistors, but memories may be formed.

While certain embodiments have been described, these embodiments have been presented byway of example only, and are not intended to limit the scope of the inventions. Indeed, the novel methods and described herein may be embodied in a variety of other forms; furthermore, various omissions, substitutions and changes in the form of the methods and described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:
    forming a silicon oxide film on a first silicon substrate having a first plane orientation:
    removing a portion of the silicon oxide film to expose a portion of the first silicon substrate;
    forming an amorphous layer on the exposed first silicon substrate and the silicon oxide film; and
    irradiating the amorphous layer with micro wave to transform the amorphous layer into a crystalline layer having the first plane orientation.
2. The method of claim 1, further comprising:
    forming transistors and/or memories on the crystalline layer.
3. The method of claim 1, further comprising:
    forming a second silicon substrate having a second plane orientation on a portion of the first silicon substrate before forming the amorphous layer,
    wherein the amorphous layer is formed above the second silicon substrate in forming the amorphous layer and is transformed into a crystalline layer having the second plane orientation in irradiating the amorphous layer with the micro wave.
4. The method of claim 3,
    wherein in forming the second silicon substrate on the portion of the first silicon substrate, the second silicon substrate is formed on whole surface of the first silicon substrate, a mask is formed on the portion of the second silicon substrate, and the first silicon substrate is ion-implanted.
5. The method of claim 4, further comprising:
    forming the transistors and/or the memories on the crystalline layer.
6. The method of claim 5, wherein
    a CMOS structure is constituted with the transistors.
7. The method of claim 6, wherein
    a p-channel transistor in the CMOS structure is formed on the second silicon substrate and an n-channel transistor in the CMOS structure is formed on the first silicon substrate.
8. The method of claim 3, wherein
    the first plane orientation is (100) and the second plane orientation is (110).
9. The method of claim 4, wherein ion species used in ion-implanting the first silicon substrate is germanium.
10. The method of claim 1, wherein:
    a micro wave frequency is set to be at least one of 2.45 GHz, 5.80 GHz or 24.125 GHz.
11. The method of claim 1, wherein
    the first silicon substrate is heated in forming the crystalline layer.
12. The method of claim 11, wherein a temperature of the silicon substrate is set to be more than 200° C. and equal or less than 550° C.
13. The method of claim 1, further comprising:
    ion-implanting into an interface between the amorphous layer and the first silicon substrate after forming the amorphous layer.
14. The method of claim 13, wherein
    ion species used in ion-implanting is germanium or argon.
15. The method of claim 1, further comprising:
    heating the first silicon substrate in a hydrogen atmosphere between exposing the portion of the first silicon substrate and forming the amorphous layer.
16. The method of claim 15, wherein
    the silicon substrate is retained in vacuum between heating the first silicon substrate and forming the amorphous layer.
17. The method of claim 15, wherein
    heating the first silicon substrate and forming the amorphous layer are performed in the same apparatus without exposing the first silicon substrate into atmosphere.

* * * * *